United States Patent
Higuchi et al.

(10) Patent No.: US 9,882,573 B2
(45) Date of Patent: Jan. 30, 2018

(54) METHOD OF FABRICATING ELECTRONIC DEVICE AND LIMIT VALUE SETTING APPARATUS

(71) Applicant: DENSO CORPORATION, Kariya, Aichi-pref. (JP)

(72) Inventors: Soichiro Higuchi, Kariya (JP); Takamasa Ando, Kariya (JP); Yutaka Hasegawa, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/901,706

(22) PCT Filed: Jun. 30, 2014

(86) PCT No.: PCT/JP2014/067348
§ 371 (c)(1),
(2) Date: Dec. 28, 2015

(87) PCT Pub. No.: WO2014/208769
PCT Pub. Date: Dec. 31, 2014

(65) Prior Publication Data
US 2016/0294405 A1 Oct. 6, 2016

(30) Foreign Application Priority Data
Jun. 28, 2013 (JP) .................. 2013-136891

(51) Int. Cl.
*H03M 1/10* (2006.01)
*H02H 3/00* (2006.01)
*H02H 3/20* (2006.01)

(52) U.S. Cl.
CPC .......... *H03M 1/1014* (2013.01); *H02H 3/006* (2013.01); *H02H 3/207* (2013.01)

(58) Field of Classification Search
CPC ......... H02M 3/157; H02M 2001/0012; H02M 3/33515; H02M 3/3376; H03M 1/1028;
(Continued)

(56) References Cited

U.S. PATENT DOCUMENTS 5,841,393 A 11/1998 Saito et al.
6,456,473 B1 * 9/2002 Olson .................... H02H 3/087
361/111

(Continued)

FOREIGN PATENT DOCUMENTS

JP H04-031835 U 3/1992
JP H05-341032 A 12/1993
(Continued)

OTHER PUBLICATIONS

International Preliminary Report on Patentability; International Application No. PCT/JP2014/067348; Filed Jun. 30, 2014 (with English translation).

(Continued)

*Primary Examiner* — Linh Nguyen
(74) *Attorney, Agent, or Firm* — Knobbe, Martens, Olson & Bear, LLP

(57) ABSTRACT

A method of fabricating an electronic device is provided, where the electronic device includes a port, an A/D converter, a memory, and a determination circuit. The determination circuit is configured to determine whether or not there is an abnormality by comparing an A/D converted value as a result of the A/D converter converting a voltage based on a power-supply voltage inputted to the port with a limit value stored in the memory. The method includes a step of inputting a predetermined voltage to the port of the electronic device to be fabricated, and a step of recording an A/D converted value as a result of the A/D converter converting (Continued)

a voltage based on the predetermined voltage inputted to the port as the limit value in the memory.

7 Claims, 5 Drawing Sheets

(58) Field of Classification Search
CPC .... H03M 1/1042; H03M 1/109; H03M 1/122; H03M 1/1052; H03M 1/1071; H03M 1/12; H03M 7/3084
USPC .............. 323/283, 284, 268, 271, 349, 351; 341/118, 120
See application file for complete search history.

(56) References Cited

U.S. PATENT DOCUMENTS

| | | | | |
|---|---|---|---|---|
| 6,577,987 | B1* | 6/2003 | Wenning | H02H 3/044 |
| | | | | 324/512 |
| 8,805,553 | B2* | 8/2014 | Moore | G05B 13/0255 |
| | | | | 700/281 |
| 2001/0035839 | A1 | 11/2001 | Shiratori et al. | |
| 2007/0171123 | A1 | 7/2007 | Nakano et al. | |
| 2009/0153855 | A1* | 6/2009 | Bungo | G01J 3/02 |
| | | | | 356/319 |
| 2010/0026262 | A1* | 2/2010 | Sase | H02M 3/156 |
| | | | | 323/283 |
| 2010/0052639 | A1* | 3/2010 | Takahashi | H02M 1/36 |
| | | | | 323/283 |
| 2010/0188785 | A1* | 7/2010 | Gascuel | H02H 3/023 |
| | | | | 361/18 |
| 2010/0223277 | A1* | 9/2010 | Yamaguchi | G05B 19/4184 |
| | | | | 707/769 |
| 2016/0056828 | A1* | 2/2016 | Ueki | H03M 1/002 |
| | | | | 341/155 |

FOREIGN PATENT DOCUMENTS

| | | |
|---|---|---|
| JP | H06-059023 A | 3/1994 |
| JP | H06-059024 A | 3/1994 |
| JP | H06-088870 A | 3/1994 |
| JP | H07-198826 A | 8/1995 |
| JP | H09-145824 A | 6/1997 |
| JP | H10-062525 A | 3/1998 |
| JP | H10-209864 A | 8/1998 |
| JP | H11-052054 A | 2/1999 |
| JP | H11-055844 A | 2/1999 |
| JP | H11-109030 A | 4/1999 |
| JP | H11-166973 A | 6/1999 |
| JP | 2001-141805 A | 5/2001 |
| JP | 2001-311772 A | 11/2001 |
| JP | 2003-090876 A | 3/2003 |
| JP | 2004-171402 A | 6/2004 |
| JP | 2005-227030 A | 8/2005 |
| JP | 2006-047051 A | 2/2006 |
| JP | 2006-047052 A | 2/2006 |
| JP | 2007-093480 A | 4/2007 |
| JP | 2007-198846 A | 8/2007 |
| JP | 2008-014762 A | 1/2008 |
| JP | 2008-102161 A | 5/2008 |
| JP | 2008-175713 A | 7/2008 |
| JP | 2008-232859 A | 10/2008 |
| JP | 2009-180737 A | 8/2009 |
| JP | 2010-014488 A | 1/2010 |
| JP | 2010-237062 A | 10/2010 |
| JP | 2012-098192 A | 5/2012 |
| JP | 2013-250735 A | 12/2013 |

OTHER PUBLICATIONS

International Search Report (translated version); International Application No. PCT/JP2014/067348, filed Jun. 30, 2014; 9 pages.
Microfilm of the specification and drawings annexed to the request of Japanese Utility Model Application No. 072067/1990 (Laid-open No. 031835/1992)—Publication No. JP H04-031835 U; Yokogawa Electric Corp, Mar. 16, 1992, fig 1. (See Reference No. 4).

* cited by examiner

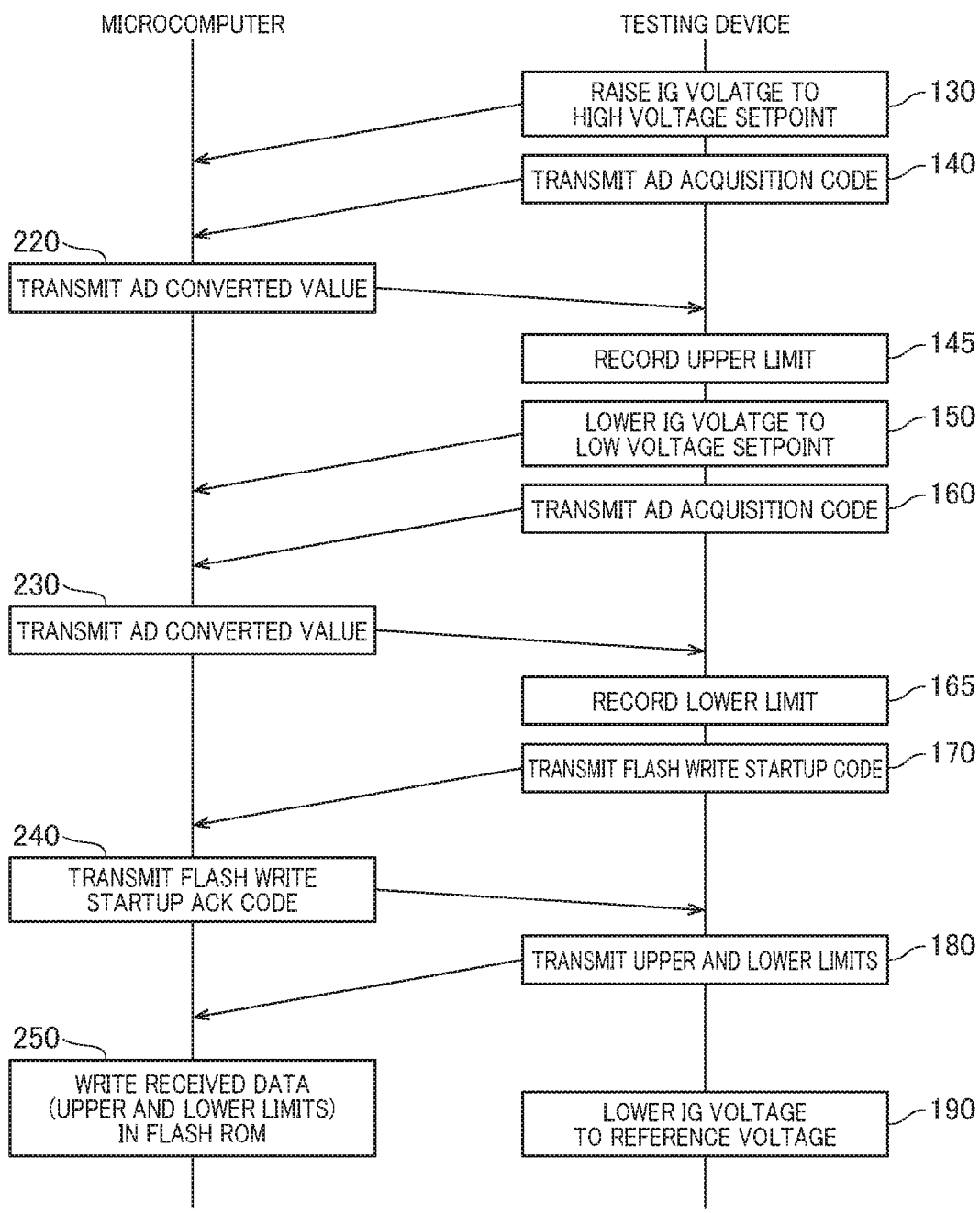

METHOD OF FABRICATING ELECTRONIC DEVICE AND LIMIT VALUE SETTING APPARATUS

BACKGROUND

Technical Field

The present invention relates to a method of fabricating an electronic device and a limit value setting apparatus.

Background Art

Conventionally, an apparatus for determining the presence of an abnormality based on a power-supply voltage applied to an electronic device (see, for example, Patent Literature 1). More specifically, according to a technique described in Patent Literature 1, the electronic device determines the presence of an abnormality based on an A/D converted value of a power-supply voltage and an upper-limit and a lower limit of a predetermined voltage range.

Patent Literature 1 JP-A-2008-232859

Technical Problem

However, due to variation in characteristics between individual analog-to-digital (A/D) converters that output A/D converted values, even if the same voltage is applied to a plurality of electronic devices of the same type number; the A/D converted values from the A/D converters of the respective electronic devices may be different. Conversely, supposing that the A/D converter of one electronic device outputs an A/D converted value, the IG voltage applied to the one electronic device can be estimated to take a value in an estimated width. The voltage range has to be narrowed with increasing estimated width.

SUMMARY

In consideration of the foregoing, it is desired to have a technique for, in an electronic device configured to determine whether or not there is an abnormality by comparing an A/D converted value of a voltage based on a power-supply voltage with a limit value, preventing the voltage range from being narrowed even in the presence of the variation in characteristics between individual A/D converters.

According to a first exemplary embodiment of the present invention, there is provided a method of fabricating an electronic device, the electronic device including a port, an A/D converter, a memory, and a determination circuit, the determination circuit being configured to determine whether or not there is an abnormality by comparing an A/D converted value as a result of the A/D converter converting a voltage based on a power-supply voltage inputted to the port with a limit value stored in the memory, the method comprising steps of: during fabrication of the electronic device, inputting a predetermined voltage to the port of the electronic device to be fabricated; and recording an A/D converted value as a result of the A/D converter converting a voltage based on the predetermined voltage inputted to the port as the limit value in the memory.

With this configuration, recording an A/D converted value as a result of the A/D converter converting a voltage based on the predetermined voltage inputted to the port as the limit value in the memory leads to compensation for the variation in characteristics between individual A/D converters in determination of the presence of an abnormality. This allows the estimated width of the power-supply voltage to be substantially narrowed, thus allows the voltage range defined by the limit value to be narrowed.

According to a second exemplary embodiment of the present invention, there is provided a method of fabricating a plurality of electronic devices, each of the electronic devices including a port, an A/D converter, a memory, and a determination circuit, the determination circuit being configured to determine whether or not there is an abnormality by comparing an A/D converted value as a result of the A/D converter converting a voltage based on a power-supply voltage inputted to the port with a limit value stored in the memory, the method comprising steps of: during fabrication of each of the plurality of the electronic devices, inputting a predetermined voltage to the port of the electronic device to be fabricated; and recording an A/D converted value as a result of the A/D converter converting a voltage based on the predetermined voltage inputted to the port as the limit value in the memory.

With this configuration, the predetermined voltage is common between the plurality of electronic devices to be fabricated. Therefore, it can be determined whether or not there is an abnormality based on a unified criterion that is not affected by the variation in characteristics between individual electronic devices.

The present invention provides an apparatus for carrying out the method of the first embodiment that is a limit value setting apparatus for applying a voltage to an electronic device, where the electronic device includes a port, an A/D converter, a memory, and a determination circuit, and the determination circuit is configured to determine whether or not there is an abnormality by comparing an A/D converted value as a result of the A/D converter converting a voltage based on a power-supply voltage inputted to the port with a limit value stored in the memory. The apparatus includes: a digital interface configured to, during set up of the limit value of the electronic device, transmit a command to the electronic device; an analog interface configured to, during set up of the limit value of the electronic device, apply a voltage to the port of the electronic device; and a control circuit configured to, during set up of the limit value of the electronic device, input a predetermined voltage to the port of the electronic device via the analog interface and transmit the command via the digital interface, thereby causing the electronic device to record an A/D converted value as a result of the A/D converter converting a voltage based on the predetermined voltage inputted to the port as the limit value in the memory.

The present invention provides an apparatus for carrying out the method of the second embodiment that is a limit value setting apparatus for applying a voltage to a plurality of electronic devices, where each of the electronic device includes a port, an A/D converter, a memory, and a determination circuit, and the determination circuit is configured to determine whether or not there is an abnormality by comparing an A/D converted value as a result of the A/D converter converting a voltage based on a power-supply voltage inputted to the port with a limit value stored in the memory. The apparatus includes: a digital interface configured to, during set up of the limit value of each of the plurality of the electronic devices, transmit a command to the electronic device; an analog interface configured to, during set up of the limit value of each of the plurality of the electronic devices, apply a voltage to the port of the electronic device; and a control circuit configured to, during set up of the limit value of each of the plurality of the electronic devices, input a predetermined voltage to the port of the electronic device via the analog interface and transmit the command via the digital interface, thereby causing the electronic device to record an A/D converted value as a result of the A/D converter converting a voltage based on the predetermined voltage inputted to the port as the limit value in the memory. The above apparatuses for carrying out the first and second embodiments can provide similar advantages to those of the methods of the first and second embodiments.

CROSS-REFERENCE TO RELATED APPLICATION

This application claims priority under the Paris Convention on Japanese Patent Application No. 2013-136891 (filed Jun. 28, 2013), the content of which is incorporated by reference herein.

BRIEF DESCRIPTION OF DRAWINGS

FIG. 4 is an example of a performance guarantee range of IG voltage, estimated widths of IG voltage, target values and the like;

FIG. 7 is a sequence diagram of operations performed for writing an upper limit and a lower limit in a flash ROM.

DESCRIPTION OF EMBODIMENTS

Figure 1:
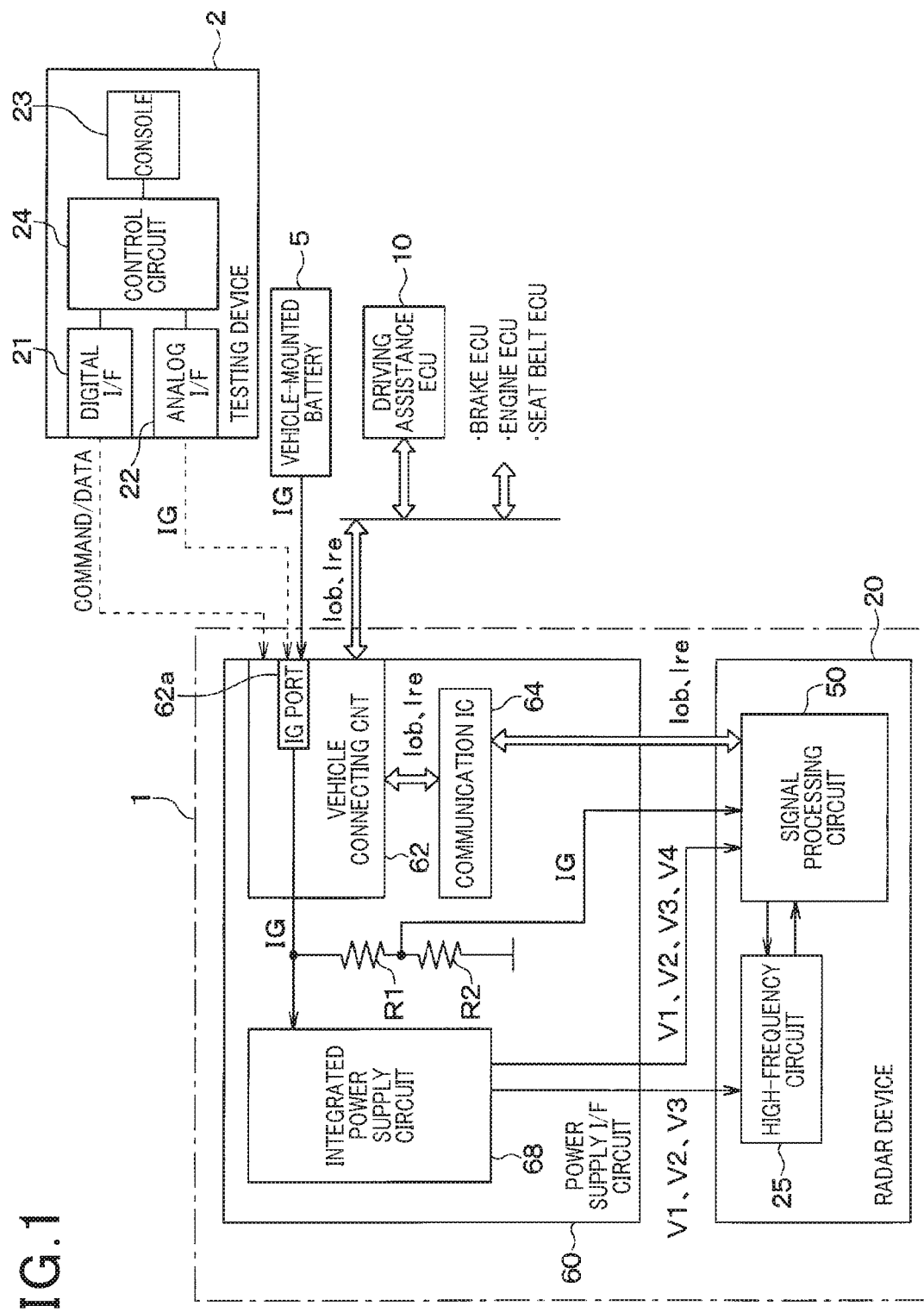
FIG. 1 is an overall diagram of a monitoring notification system, a testing device and others in accordance with one embodiment of the present invention.

One embodiment of the present invention will now be explained. As shown in FIG. 1, a monitoring notification system 1 is mounted in a vehicle. The monitoring notification system 1 includes a radar device 20 and a power supply interface (I/F) circuit 60 and is configured to at least monitor operating conditions of the radar device 20 and output the operating conditions to external devices mounted in the vehicle other than the monitoring notification system 1.

The radar device 20 is a FMCW-based millimeter-wave radar device including a high-frequency circuit 25 and a signal processing circuit 50. The radar device 20 transmits a radar wave and receives a reflected wave (hereinafter referred to as an incoming wave), thereby generating information (hereinafter referred to as target information) Iob about targets that reflected the radar wave. The radar device 20 outputs the generated target information Iob and a monitored operating condition of the radar device 20 (hereinafter referred to as condition monitoring result) Ire to external devices.

The targets, in the present embodiment, refers to reflecting points, on an object, that reflected the radar wave. Normally, the radar device 20 detects the targets respectively corresponding to different objects. In addition, the target information Iob of the present embodiment includes at least a distance from a subject vehicle (or own vehicle) to a detected target, a direction relative to a predefined reference axis in which the target exists (i.e., an angle, hereinafter referred to as an incoming direction) in which the detected target exists, and a relative speed of the target relative to the subject vehicle. External devices, such as a driving assistance electronic control unit (ECU) 10, a brake ECU, an engine ECU, a seat belt ECU and others, are connected to the monitoring notification system 1 of the present embodiment.

The driving assistance electronic control unit (ECU) 10 is primarily formed of a well-known microcomputer including at least ROM, RAM, and CPU, and includes a bus controller for at least communications via a communication bus. In addition, a warning buzzer, a monitor, a cruise control switch, a target inter-vehicle distance setting switch and others are connected to a driving assistance ECU 10.

That is, the driving assistance ECU 10 performs driving assistance control for assisting driving of the subject vehicle based on the target information Job and the condition monitoring result Ire from the radar device 20. The driving assistance control includes, for example, adaptive cruise control (ACC) in which an inter-vehicle distance between a preceding vehicle and the subject vehicle is kept at a predetermined distance, and pre-crash safety (PCS) control in which, if the inter-vehicle distance between a preceding vehicle and the subject vehicle becomes less than a predetermined distance, a warning is emitted or a seat belt is retracted.

In addition, the power supply I/F circuit 60 converts an IG voltage applied from a vehicle-mounted battery 5 to generate voltages V1, V2, V3, V4, and supplies the voltages V1, V2, V3, V4 to the radar device 20. Further, the power supply I/F circuit 60 outputs the target information Job and the condition monitoring result Ire generated in the radar device 20 to at least the driving assistance ECU 10.

For implementation, the power supply I/F circuit 60 includes a vehicle connecting connector (CNT) 62, a communication IC 64, an integrated power supply circuit 68, and resistors R1, R2.

The vehicle connecting CNT 62 is a connector connected to the driving assistance ECU 10 and the vehicle-mounted battery 5. The vehicle-mounted battery 5 is a well-known secondary battery mounted in the subject vehicle. When the ignition switch is turned on, the vehicle-mounted battery 5 starts to apply the IG voltage to various devices mounted in the subject vehicle. More specifically, the IG voltage (corresponding to an example of a voltage based on the power-supply voltage) applied from the vehicle-mounted battery 5 is inputted to one IG port 62a of the vehicle connecting CNT 62.

The communication IC 64 outputs the target information Job and the condition monitoring result Ire generated in the radar device 20 to the driving assistance ECU 10 via the vehicle connecting CNT 62. A communication scheme, according to which the communication IC 64 communicates with the external devices via the vehicle connecting CNT 62, is a well-known communication scheme, such as a controller area network (CAN).

The integrated power supply circuit 68 is a power supply circuit for converting the IG voltage supplied from the vehicle-mounted battery 5 to generate the voltages V1, V2, V3, V4 (corresponding to an example of a voltage based on the power-supply voltage) necessary to the radar device 20 and supplying the voltages V1, V2, V3, V4 to the radar device 20. The voltage V1 is a negative voltage to be supplied to the high-frequency circuit 25 of the radar device 20. The voltage V2 is a drive voltage to drive the radar device 20. The voltage V3 is a positive voltage to be supplied to the high-frequency circuit 25 of the radar device 20. The voltage V4 is a drive voltage to drive a portion of the signal processing circuit 50.

That is, the power supply I/F circuit 60 converts the IG voltage supplied from the vehicle-mounted battery 5 via the vehicle connecting CNT 62 to generate the voltages V1, V2, V3, V4 and supplies the voltages V1, V2, V3, V4 to the radar device 20.

Further, the power supply I/F circuit 60 outputs the target information Iob and the condition monitoring result Ire generated in the radar device 20 to at least the driving assistance ECU 10.

The resistors R1 and R2 are resistors for dividing the IG voltage inputted to an IG port 62a. The divided IG voltage (corresponding to an example of a voltage based on the power-supply voltage) is inputted to the signal processing circuit 50.

At the factory of the monitoring notification system 1, an operator connects the testing device (diagnosis tool) 2, instead of the vehicle-mounted battery 5 and the external devices (the driving assistance ECU 10 and the like), to the vehicle connecting CNT 62, and tests the monitoring notification system 1 using the testing device 2.

Then, the testing device 2 is connected to the vehicle connecting CNT 62 via a command/data line for communicating with the monitoring notification system 1 and an IG line for applying the IG voltage. Instead of the IG voltage from the vehicle-mounted battery 5, the IG voltage outputted from the testing device 2 is connected to the IG port 62a via the IG line.

The testing device 2 (corresponding to an example of limit value setting apparatus) is a well-known device that is also referred to as a diagnosis tool, and includes, as shown in FIG. 1, a digital interface 21, an analog interface 22, a console 23, and a control circuit 24. The digital interface 21 is an interface circuit that is connected to the vehicle connecting CNT 62 via the command/data line to transmit and receive digital data, such as commands and data and the like. The analog interface 22 is an interface circuit that is connected to the IG port 62a via the IG line to apply the IG voltage to the port 62a. The console 23 is a member for receiving operations of the operator. The control circuit 24 may be a microcomputer to implement various controls by executing programs.

A configuration of the radar device 20 will now be explained in detail. As described above, the radar device 20 is an FMCW-based millimeter-wave radar device and includes the high-frequency circuit 25 and the signal processing circuit 50.

Figure 2:
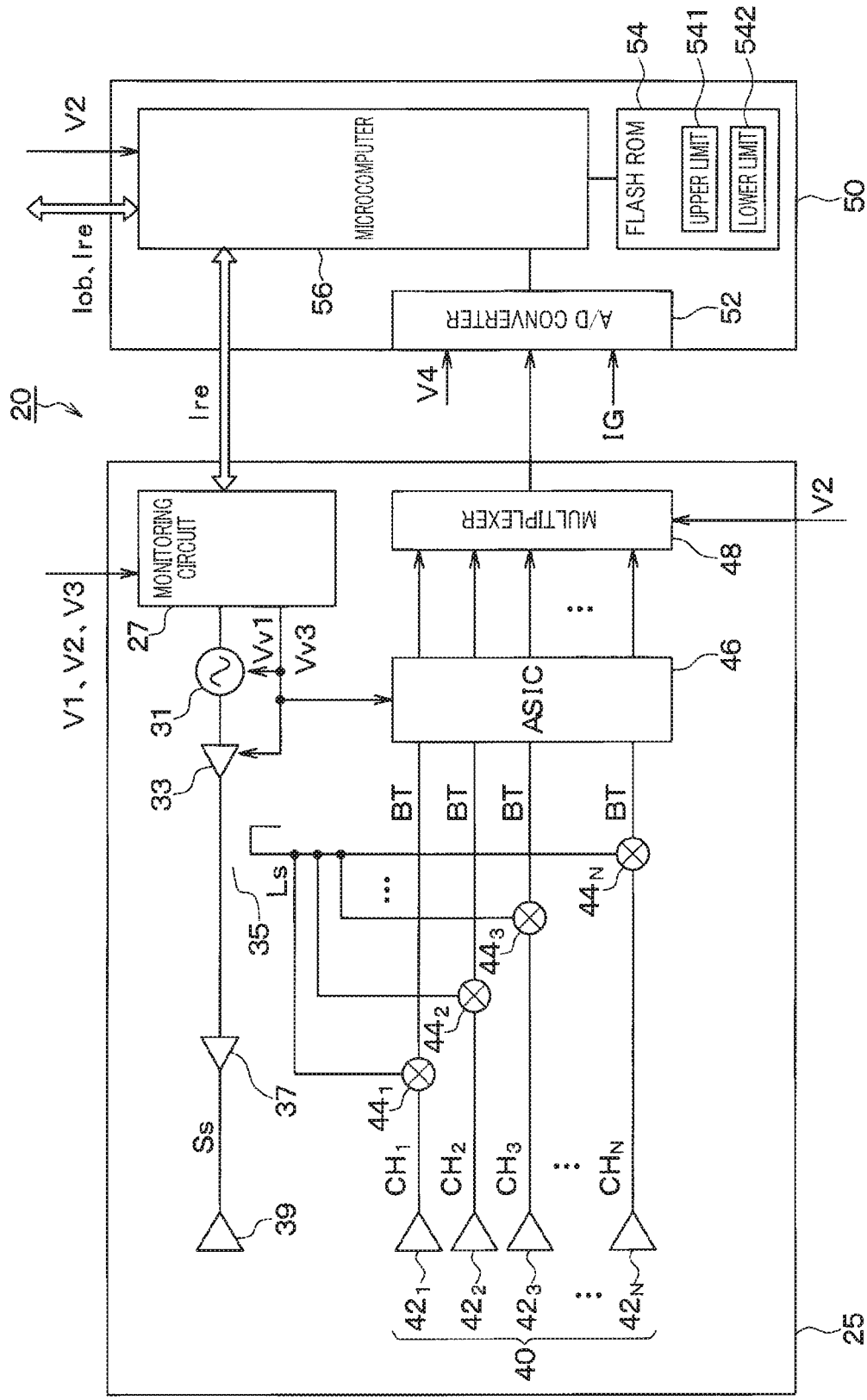
FIG. 2 is a block diagram of a radar device shown in FIG. 1.

The high-frequency circuit 25 is configured to transmit and receive a radio wave in the millimeter waveband as the radar wave. More specifically, as shown in FIG. 2, the high-frequency circuit 25 includes a monitoring circuit 27, an oscillator 31, an amplifier 33, a distributor 35, an amplifier 37, and a transmit antenna 39. The high-frequency circuit 25 further includes receive antennas 40, mixers 441-44n, an ASIC 46, and a multiplexer 48.

The oscillator 31 generates a modulated radio-frequency signal in the millimeter waveband, where one modulation period has an ascent interval in which the frequency is linearly increasing with time and a descent interval in which the frequency is linearly decreasing with time. The amplifier 33 amplifies a radio-frequency signal generated in the oscillator 31.

The distributor 35 power-splits an output of the amplifier 22 into a transmit signal Ss and a local signal Ls. The amplifier 37 amplifies the transmit signal Ss of the output of the distributor 35. The transmit antenna 39 emits a radar wave corresponding to the transmit signal Ss amplified in the amplifier 37.

The receive antennas 40 form an array of N (N: a positive integer greater than one) antennas 421-42N for receiving the radar wave. The antennas 421-42N are assigned the channels CH1-CHN, respectively.

The mixers 441-44N mix received signals Sr received at the respective antennas 421-42N with the local signal L to generate beat signals BT each indicative of a frequency difference between the transmit signal Ss and the received signal Sr. In the present embodiment, the mixers 441-44N are provided for the channels CH1-CHN, one for each channel.

The ASIC 46 is an integrated circuit (IC) having a filter function of filtering out unnecessary signal components from the beat signals BT generated in the mixers 441-44n and an amplifier function of amplifying the beat signals BT after being passed through the filter.

The multiplexer 48 outputs the received beat signals BT to the signal processing circuit 50. The monitoring circuit 27 supplies drive voltages to respective components of the high-frequency circuit 25 and outputs, to the oscillator 31, a transmit command indicative of initiation of transmission of the radar wave. More specifically, the monitoring circuit 27 generates a voltage Vv1 of a negative voltage (e.g., −3 [V]) based on the voltage V1 from the power supply I/F circuit 60. The monitoring circuit 27 generates a voltage Vv3 of a positive voltage (e.g., 5 [V]) based on the voltage V3 from the power supply I/F circuit 60. The monitoring circuit 27 supplies the generated voltages Vv1, Vv3 to the oscillator 31, the amplifier 33, the amplifier 37, and the ASIC 46.

In addition, based on a result of monitoring the voltages at the components of the high-frequency circuit 25 (hereinafter referred to as monitoring voltages) and a result of communicating with the signal processing circuit 50, the monitoring circuit 27 performs a monitoring process to determine whether or not there is an abnormality in the radar device 20. Upon initiation of application of the voltage V1 to the monitoring circuit 27, the monitoring process is performed repeatedly.

In the monitoring circuit 27 of the present embodiment, voltages to be monitored as monitoring voltages include, for example, the voltage Vv1, the voltage Vv3 applied to the oscillator 31, the amplifier 33, and the amplifier 37, and a transmit voltage of the radar wave.

That is, in the monitoring process, for example, if the monitoring voltage is out of a predefined range, or if a communications failure occurs between the monitoring circuit 27 and the signal processing circuit 50, it is determined that there is an abnormality in the high-frequency circuit 25. Thus, in the monitoring process, if it is determined that there is an abnormality in the high-frequency circuit 25, the monitoring circuit 27 outputs, to the signal processing circuit 50, an abnormality notification indicative the presence of an abnormality in the high-frequency circuit 25 as the condition monitoring result Ire.

A configuration of the signal processing circuit 50 will now be explained in detail. The signal processing circuit 50 includes an A/D converter 52, a flash read only memory (ROM) 54, and a microcomputer 56.

The A/D converter 52 converts the beat signals BT from the multiplexer 48 and the IG voltage divided by the resistors R1, R2 of the power supply I/F circuit 60 into digital data and outputs the digital data. The flash ROM 54 (corresponding to an example of memory) stores processing programs performed in the microcomputer 56, the condition monitoring results Ire from the monitoring circuit 27, and an upper limit 541 and a lower limit 542 described later of the IG voltage (respectively corresponding to limit values).

The microcomputer 56 (corresponding to an example of determination circuit) is a well-known microcomputer including Central Processing Unit (CPU), Read Only Memory (ROM), Random Access Memory (RAM) and others, and is configured to detect targets based on the beat signals BT converted in the A/D converter 52, generate the target information Iob about the respective targets, and output the target information Job to the external devices via the power supply I/F circuit 60.

Upon initiation of supply of the voltage V1 from the power supply I/F circuit 60, the microcomputer 56 is activated. Upon activation, the microcomputer 56 performs an initial process. In the initial process, the microcomputer 56 determines whether or not there is an abnormality in the signal processing circuit 50, thus in the radar device 20, based on a result of monitoring the voltages at specified components, a result of communicating with the monitoring circuit 27, a result of communicating with the external devices.

In the initial process, the voltages at the components to be monitored refer to, for example, the IG voltage converted in the A/D converter 52, the voltage V2 applied to the microcomputer 56, the voltages V1, V2 applied to the monitoring circuit 27 and others. The microcomputer 56 outputs a result of the monitoring process from monitoring circuit 27 (i.e., the condition monitoring result Ire) to the external devices (e.g., the driving assistance ECU 10) via the power supply I/F circuit 60.

Figure 3:
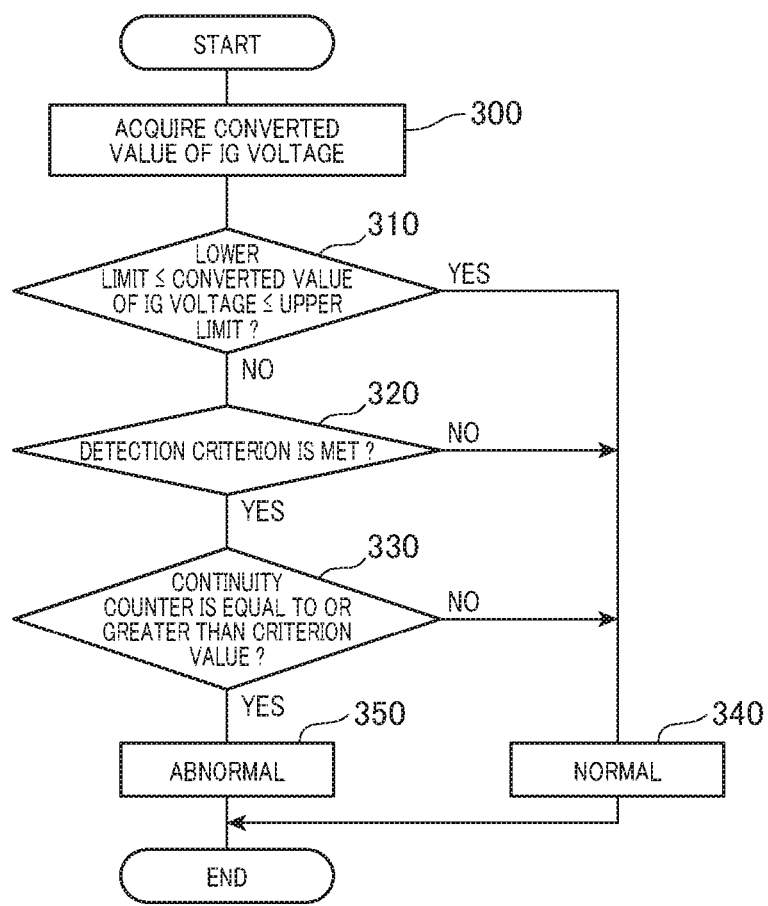
FIG. 3 is a flowchart of an IG voltage monitoring process.

The operations of the monitoring notification system 1 configured as above will now be explained. A process is explained, in which the microcomputer 56 monitors the IG voltage converted in the A/D converter 52. FIG. 3 shows in detail this ID-voltage monitoring process.

In normal use, the microcomputer 56 performs the ID-voltage monitoring process in the above initial process and at other plural timings (including, e.g., periodically visiting timings or receipt timings of requests from the external devices). During normal use, the IG voltage is applied from the vehicle-mounted battery 5 to the monitoring notification system 1 mounted in the vehicle via the IG port 62a.

In the ID-voltage monitoring process, the microcomputer 56 utilizes a continuity counter as a variable. The continuity counter is set to zero at startup of the microcomputer 56 and its value is updated in the ID-voltage monitoring process.

The ID-voltage monitoring will now be explained in more detail. First, in step 300, the IG voltage is inputted to the microcomputer 56 via the IG port 62a, where the IG voltage is divided by the resistors R1 and R2 and then converted into digital data by the A/D converter 52. After conversion, the converted value is an A/D converted value of a voltage based on the IG voltage. In the following, such a converted value is simply referred to as an A/D converted value.

Subsequently, in step 310, the acquired A/D converted value is compared with the upper limit 541 and the lower limit 542 recorded in the flash ROM 54. More specifically, it is determined whether or not the A/D converted value falls within a range between the lower limit value 542 and the upper limit 541.

If it is determined that the A/D converted value falls within the range, then the process proceeds to step 340, where it is determined that the IG voltage received at the IG port 62a is normal and the continuity counter is set to zero. Then the ID-voltage monitoring process in the current cycle ends. If it is determined that the A/D converted value is out of the range, the process proceeds to step 320 because the A/D converted value is an over-voltage or an under-voltage.

In step 320, it is determined whether or not a detection criterion is met. For example, it may be determined whether or not the detection criterion is met by determining whether or not a vehicle speed acquired from the external devices via the communication IC 64 is equal to or higher than a reference velocity different from 0 km/h (e.g., 20 km/h).

Typically, the detection criterion is not met at engine startup. The IG voltage significantly varies at engine startup, but such variation is not regarded as an abnormality. Therefore, the detection criterion is set beforehand such that the detection criterion is not met at engine startup.

If the detection criterion is not met, the process proceeds to step 340, where it is determined that the IG voltage received at the IG port 62a is normal and the continuity counter is set to zero. Then the ID-voltage monitoring process in the current cycle ends. If the detection criterion is met, then the process proceeds to step 330.

In step 330, the continuity counter is incremented by one, and then it is determined whether or not the continuity counter is equal to or greater than a criterion value (which may be one or greater than one, for example, may be two). If it is determined that the continuity counter is equal to or greater than the criterion value, then the process proceeds to step 350. Only if the process from step 320 to step 330 is continuously repeated the criterion number or more of times, the process can proceed to step 350.

In step 350, it is determined that the IG voltage received at the IG port 62a is abnormal. The condition monitoring result Ire including this determination result is outputted to the driving assistance ECU 10 and other external devices via the power supply I/F circuit 60. After step 350, the ID voltage monitoring process in the current cycle ends.

In this way, the microcomputer 56 is configured to notify the driving assistance ECU 10 of the abnormality in the IG voltage based on the determination that the A/D converted value is below the lower limit or above the upper limit. That is, the presence of the abnormality in the IG voltage is determined based on whether or not the A/D converted value is out of the range between the lower limit and the upper limit.

A relationship between the performance guarantee range for the IG voltage of the radar device 20 and the upper and lower limits will now be explained with reference to FIG. 4. The performance guarantee range is a range of the IG voltage in which the radar device can normally operate, within which range manufacturers or sellers provide guarantees (to, for example, their sale destinations of the monitoring notification systems 1).

Figure 4:
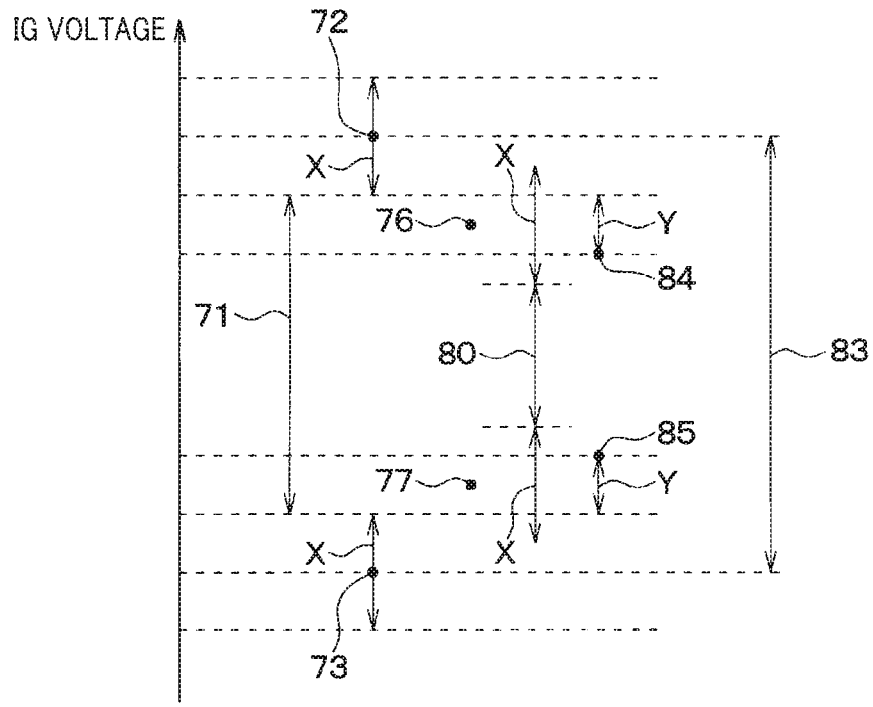

Referring to a graph of FIG. 4 where the IG voltage inputted to the IG port 62a is indicated by the ordinate axis, the performance guarantee range is given by a range 71. Commonly, in such a case, the IG voltage range within which the radar device 20 can normally operate is actually much broader because the performance guarantee range is determined with margin.

An IG voltage 72 higher than the upper limit of the performance guarantee range 71 and an IG voltage 73 lower than the lower limit of the performance guarantee range 71, which are referred to as target values, are intended to be set such that, if the IG voltage inputted to the IG port 62a is out of a range between the IG voltages 72 and 73, the IG voltage is determined to be abnormal.

However, in such a case, "design" A/D converted values that are simply acquired from the A/D converter 52 when the IG voltages 72, 73 are inputted to the IG port 62a should not be recorded in the flash ROM 54 as the upper limit 541 and the lower limit 542. This is because, due to variation in characteristics between individual A/D converters 52, even if the same IG voltage is applied to a plurality of products (i.e., a plurality of monitoring notification systems 1), the A/D converted values outputted from the A/D converters 52 of the monitoring notification systems 1 may vary with individual products.

Conversely, taking into account the variation in characteristics between individual A/D converters 52, when the A/D converter 52 of a certain monitoring notification system 1 outputs an A/D converted value, the IG voltage inputted to the IG port 62a of the monitoring notification system 1 does not necessarily take the design voltage value corresponding to the A/D converted value, but may be estimated to take a value within an estimated width centered at the design voltage value corresponding to the A/D converted value.

Such an estimated width of the IG voltage may increase not only due to the variation in characteristics between individual A/D converters 52, but also due to environmental factors, such as a temperature and others. By integrating (summing) the estimated widths of the IG voltage caused by these various factors, an estimated width of the IG voltage inputted to the IG port 62a may take a value X.

In such a case, it is safe that the upper limit 541 to be recorded in the flash ROM 54 is a lower limit of the width X centered at the target voltage 72 and the lower limit 542 to be recorded in the flash ROM 54 is an upper limit of the width X centered at the target voltage 73.

However, for various reasons (e.g., a business reason), the target values may have to take values 76, 77 within the performance guarantee range 71.

In addition, the driving assistance ECU 10 also has its performance guarantee range 83 for, e.g., the IG voltage. The driving assistance ECU 10 is configured to, if the voltage inputted from the vehicle-mounted battery 5 to the driving assistance ECU 10 is out of the performance guarantee range 83, determine that the IG voltage is abnormal. The monitoring notification system 1 may have to detect the abnormality in the IG voltage earlier than the driving assistance ECU 10. In such a case, the target values may have to take values 76, 77 within the performance guarantee range 83 of the driving assistance ECU 10.

If, in such a case, the estimated width of the IG voltage is estimated to be a width X, the upper limit 541 is set to the lower limit of the width X centered at the voltage 76 and the lower limit 542 is set to the upper limit of the width X centered at the voltage 77. As a result, a range between the upper limit 541 and the lower limit 542 will be narrowed like a width 80. That is, there is a problem that the range between the upper limit and the lower limit is narrowed as the estimated width is increased. To prevent such a problem, the estimated width of the IG voltage has to be narrower than the width X.

To this end, in the present embodiment, each of the plurality of monitoring notification systems 1 is tested using a testing device 2 at the factory and the upper limit 541 and the lower limit 542 are recorded in the flash ROM 54 of the monitoring notification systems 1.

More specifically, a predetermined high voltage 84 is inputted to the IG port 62a using the testing device 2. The A/D converted value outputted from the A/D converter 52 of the monitoring notification system 1 is recorded as the upper limit 541 in the flash ROM 54. In addition, a predetermined low voltage 85 is inputted to the IG port 62a using the testing device 2. Then the A/D converted value outputted from the A/D converter 52 of the monitoring notification system 1 is recorded as the lower limit 542 in the flash ROM 54.

The respective characteristics of the A/D converter 52 are reflected in the upper limit 541 and the lower limit 542, which allows the estimated width of the IG voltage to be a width Y narrower than the width X. Therefore, the high voltage is a lower limit 84 of the width Y centered at the voltage 76 and the low voltage is an upper limit 85 of the width Y centered at the voltage 77.

In the following, the operations of each of a plurality of monitoring notification systems 1 to be tested and the testing device 2 when the monitoring notification system 1 is tested using the testing device 2 will be explained with reference to FIGS. 5 to 7. For each of the plurality of monitoring notification systems 1, a method of fabricating the monitoring notification system 1 includes a step of testing the monitoring notification system 1. This fabricating method includes at least a step of preparing the monitoring notification system 1 configured as above and the step of testing the monitoring notification system 1.

Figure 5:
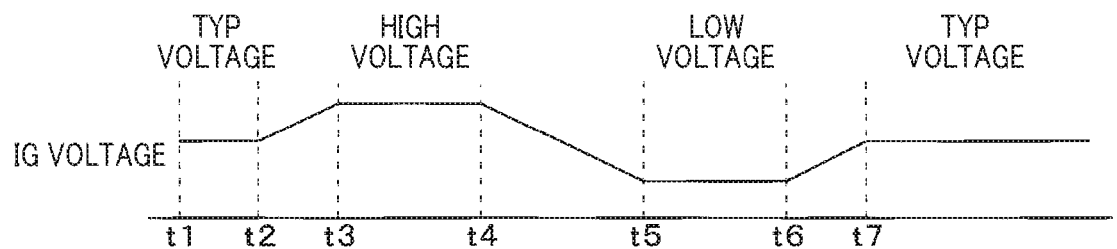
FIG. 5 is a time variation in IG voltage applied by a testing device during testing.

FIG. 5 shows a time variation of the IG voltage applied from the testing device to the IG port 62a of the monitoring notification system 1 to be tested (during fabrication of the monitoring notification system 1 and limit values are to be set in the monitoring notification system 1). FIG. 6 shows a sequence diagram of operations performed during transition to a testing mode. FIG. 7 shows a sequence diagram of operations performed for writing the upper limit and the lower limit in the flash ROM.

During testing, the operator connects the testing device 2 to the monitoring notification system 1 to be tested that is connected to neither the vehicle-mounted battery nor the external devices, such as the driving assistance ECU 10 and others. More specifically, the digital interface 21 is connected to the vehicle connecting CNT 62 via a command/data line. The analog interface 22 is connected to the IG port 62a via an IG line. This allows the command/data line and the IG voltage line (each indicated by the dotted line in FIG. 1) originating from the testing device 2 to be connected to the vehicle connecting CNT 62. Particularly, the IG voltage line is connected to the IG port 62a to receive the IG voltage from the vehicle-mounted battery 5.

Thus, commands and data can be transmitted and received between the microcomputer 56 and the control circuit 24 via the digital interface 21, the vehicle connecting CNT 62, and the communication IC 64. In addition, the IG voltage from the analog interface 22 of the testing device 2 can be inputted to the integrated power supply circuit via the IG port 62a, and the IG voltage from the analog interface 22 can be inputted to the A/D converter 52 via the IG port 62s after being divided by the resistors R1, R2.

Subsequently, an operator takes a given operation on the console 23 of the testing device 2 in a predetermined manner. Then the control circuit 24 performs the following operations by executing predetermined programs.

Figure 6:
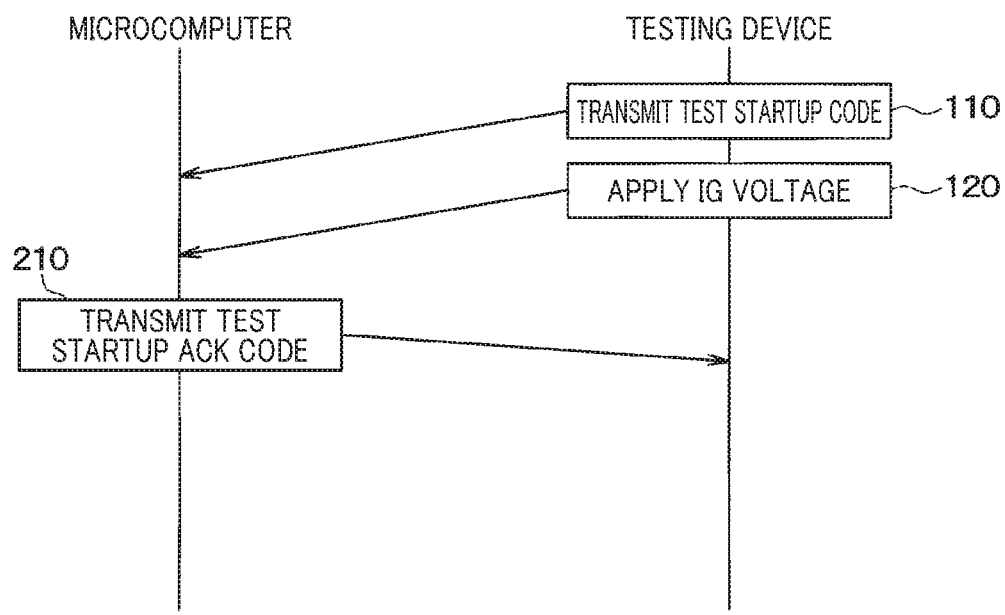
FIG. 6 is a sequence diagram of operations performed during transition to a testing mode.

In step 110 of FIG. 6, the control circuit 24 transmits a testing startup code as one of testing commands via the digital interface 21 and the command/data line. In step 120, the control circuit 24 initiates application of the IG voltage to the IG port 62a via the analog interface 22 and the IG line. This time point corresponds to time point t1 in FIG. 5. The IG voltage takes a value of TYP voltage (that is, a reference voltage, e.g., of 12 volts (V)).

The microcomputer 56 receives the testing startup code from the communication IC 64 and transitions to a testing mode in response to the received testing startup code. In step 210, the microcomputer 56 transmits a testing startup acknowledgment (ACK) code to the testing device 2 via the communication IC 64.

Upon receipt of the testing startup ACK code via the command/data line and the digital interface 21, the control circuit 24 proceeds to step 130 of FIG. 7. In step 130, the control circuit 24 raises the IG voltage to be inputted to the IG port 62a to a predetermined high voltage setpoint by controlling the analog interface 22. This high voltage setpoint corresponds to the voltage 84 shown in FIG. 4. With this process, as shown in FIG. 5, the IG voltage starts to rise at time point t2, reaches the high voltage setpoint at time point t3, and then stabilizes at the high voltage setpoint.

After step 130, the control circuit 24 waits for a predetermined period of time that is long enough for the IG voltage to stabilizes at the high voltage setpoint. Thereafter, in step 140, the control circuit 24 transmits an AD acquisition code as one of the testing commands via the digital interface 21 and the command/data line.

The microcomputer 56 receives the AD acquisition code from the communication IC 64, and in step 220, acquires the A/D converted value from the A/D converter 52 in response to the AD acquisition code. The microcomputer 56 transmits the acquired A/D converted value as A/D converted data to the testing device 2 via the communication IC 64. Upon receipt of the A/D converted data via the command/data line and the digital interface 21, the control circuit 24 records the received A/D converted data as an upper limit in its own memory (not shown) in step 145.

Subsequently, the control circuit 24 proceeds to step 150, where the control circuit 24 lowers the IG voltage to be inputted to the IG port 62a to a predetermined low voltage setpoint by controlling the analog interface 22. This low voltage setpoint corresponds to the voltage 85 shown in FIG. 4. With this operation, as shown in FIG. 5, the IG voltage starts to drop at time point t4, reaches the low voltage setpoint at time point t5, and then stabilizes at the low voltage setpoint.

After step 150, the control circuit 24 waits for a predetermined period of time that is long enough for the IG voltage to stabilizes at the low voltage setpoint. Thereafter, in step 160, the control circuit 24 transmits the AD acquisition code as one of the testing commands via the digital interface 21 and the command/data line.

The microcomputer 56 receives the AD acquisition code from the communication IC 64, and in step 230, acquires the A/D converted value from the A/D converter 52 in response to the AD acquisition code. The microcomputer 56 transmits the acquired A/D converted value as A/D converted data to the testing device 2 via the communication IC 64. Upon receipt of the A/D converted data via the command/data line and the digital interface 21, the control circuit 24 records the received A/D converted data as a lower limit in its memory (not shown) in the control circuit 24 in step 165.

Subsequently, the control circuit 24 proceeds to step 170, where the control circuit 24 transmits a flash write code as one of the testing commands via the digital interface 21 and the command/data line. The microcomputer 56 receives the flash write code via the communication IC 64, and in step 240, transmits a flash write startup acknowledgment (ACK) code to the testing device 2 via the communication IC 64 in response to the received flash write code.

Upon receipt of the flash write startup ACK code via the command/data line and the digital interface 21, the control circuit 24 proceeds to step 180. In step 180, the control circuit 24 transmits data of the upper limit recorded in step 145 and data of the lower limit recorded in step 165 via the digital interface 21 and the command/data line.

The microcomputer 56 receives the data of the upper limit and the lower limit via the communication IC 64, writes the received upper limit as the upper limit 541 in the flash ROM 54 and the received lower limit as the lower limit 542 in the flash ROM 54.

After step 180, the control circuit 24 proceeds to step 190, where the control circuit 24 raises the IG voltage to be inputted to the IG port 62a so that the IG voltage returns to the TYP voltage. With this operation, as shown in FIG. 5, the IG voltage starts to rise at time point t6, reaches the TYP voltage at time point t6, and then stabilizes at the TYP voltage.

The control circuit 24 may be configured to conduct other testings (for, e.g., voltages V1, V2, V3, V4) during a time period from time point t1 to time point t2 and a time period after time point t7.

After the testing shown in FIGS. 5 to 7 is completed for one of the plurality of monitoring notification systems 1, another similar testing is performed for another one of the plurality of monitoring notification systems 1.

In this way, when a plurality of monitoring notification systems 1 are tested, for each of the monitoring notification systems 1, the testing device 2 inputs the IG voltage 84 of the high voltage setpoint to the IG port 62a (in step 130). Then the A/D converted value outputted from the A/D converter 52 of the monitoring notification system 1 is maintained (in steps 140, 145) and recoded as the upper limit 541 in the flash ROM 54 (in steps 170, 180). The testing device 2 inputs the IG voltage 85 of the low voltage setpoint to the IG port 62a (in step 150). Then the A/D converted value outputted from the A/D converter 52 of the monitoring notification system 1 is maintained (in steps 160, 165) and recoded as the lower limit 542 in the flash ROM 54 (in steps 170, 180).

The same high voltage setpoint and the same low-voltage setpoint are used to test the respective monitoring notification systems 1. Therefore, it can be determined whether or not there is an abnormality in each of the plurality of electronic devices based on the unified criterion that is not affected by the variation in characteristics between individual electronic devices.

In this way, the IG voltage of the same value (the high voltage setpoint or the low-voltage setpoint) is inputted to the plurality of monitoring notification systems 1 and readings of the divided IG voltage from the A/D converters 52 (i.e., A/D converted values) are recorded in the flash ROMs 54. It is less likely that all the A/D converted values of the IG voltage for all the monitoring notification system 1 are identical, but rather the A/D converted values of the IG voltage for all the monitoring notification systems 1 are different from each other. This is, as above, due to the presence of factors, such as the variation in characteristics between individual A/D converters 52.

In this way, the A/D converted values (the upper and lower limits) recorded in the flash ROMs 54 of the plurality of monitoring notification systems 1 vary depending on the characteristics of the A/D converters 52 of the respective monitoring notification systems 1. However, the A/D converted values (the upper limit 541 and the lower limit 542) recorded in this way are used later in the process of FIG. 3 as thresholds (for the determination in step 310) to determine whether or not there is an abnormality in the IG voltage.

Thus, compensation for the variation in characteristics between individual A/D converters 52 in the determination of the presence or absence of the IG voltage abnormality allows the estimated width of the IG voltage to be narrowed like the width Y and can thus prevent the voltage range between the upper and lower limits from being narrowed.

The operations in steps 130, 150 correspond to an example of inputting step. The operations in steps 140, 145, 160, 165, 170, 180 correspond to an example of recording step.

Other Embodiments

The present invention is not limited to the above-described embodiments. Modifications can be made as appropriate within the scope recited in the scope of claims. In addition, the above-described embodiments are not unrelated to each other and can be combined as appropriate, excluding when combination is clearly not possible. In addition, it goes without saying that, in each of the above-described embodiments, elements configuring the embodiment are not necessarily requisites unless when particularly and explicitly described as being a requisite, when the element is clearly considered a requisite based on principle, and the like. Further, in each of the above-described embodiments, where numerical values, such as quantity, value, amount, and range, of a constituent element of the embodiment are mentioned, the numerical values are not limited to the specified numbers unless when particularly and explicitly described as being a requisite, when the numerical value is clearly limited to the specified numbers based on principle, and the like. Still further, in each of the above-described embodiments, where a shape or a positional relationship of a constituent element of the embodiment is mentioned, the shape or the positional relationship is not limited to the specified shape or positional relationship unless when the shape or positional relationship is clearly limited to the specified shape or positional relationship based on principle, and the like. For example, the present invention also permits the following embodiments. For example, the following modifications are acceptable.

(First Modification)

In the embodiment, the testing device 2 inputs the IG voltage 84 of the high voltage setpoint to the IG port 62a of the monitoring notification system 1, where the A/D converted value outputted from the A/D converter 52 is recorded as the upper limit 541 in the flash ROM 54. In addition, the testing device 2 inputs the IG voltage 85 of the low voltage setpoint to the IG port 62a of the monitoring notification system 1, where the A/D converted value outputted from the A/D converter 52 is recorded as the lower limit 542 in the flash ROM 54.

In an alternative embodiment, for example, the upper limit 541 is treated as described in the above embodiment. The A/D converted value based on the IG voltage 85 is not recorded as the lower limit 542 in the flash ROM 54. Instead, the lower limit 542 in the flash ROM 54 may be set to be a constant value independent of the monitoring notification systems 1.

In another alternative embodiment, the lower limit 542 is treated as described in the above embodiment. The A/D converted value is not recorded as the upper limit 541 in the flash ROM 54. Instead, the upper limit 541 in the flash ROM 54 may be set to be a constant value independent of the monitoring notification systems 1.

Even in such embodiments, part of the variation in characteristics between the A/D converters 52 can be compensated for, which can reduce the estimated width of the IG voltage, and can prevent the voltage range between the upper and lower limits from being narrowed.

(Second Modification)

In the above embodiment where the plurality of monitoring notification systems 1 are tested, the IG voltage 84 of the high voltage setpoint to be inputted to the IG port 62a is constant independent of the monitoring notification systems 1 to be tested and the IG voltage 85 of the low voltage setpoint to be inputted to the IG port 62a is constant independent of the monitoring notification systems 1 to be tested.

In an alternative embodiment, for example, during testing, the testing device 2 may change the IG voltage 84 of the high voltage setpoint and the IG voltage 85 of the low voltage setpoint as a function of a surrounding temperature of a receptive one of the monitoring notification systems 1 to be tested.

Also in such an embodiment, if the surrounding temperatures of some of the plurality of monitoring notification systems 1 are identical, the IG voltage 84 of the high voltage setpoint to be inputted to the IG port 62a and the IG voltage 85 of the low voltage setpoint to be inputted to the IG port 62a may be respectively common between some of the plurality of monitoring notification systems 1 having the same surrounding temperature.

In this way, even though the IG voltage 84 of the high voltage setpoint to be inputted to the IG port 62a and the IG voltage 85 of the low voltage setpoint to be inputted to the IG port 62a may vary with the environmental factors, the IG voltage 84 of the high voltage setpoint to be inputted to the IG port 62a and the IG voltage 85 of the low voltage setpoint to be inputted to the IG port 62a may be respectively set constant depending on which ones of the plurality of monitoring notification systems 1 are to be tested.

(Third Modification)

In the above embodiment, the method of setting the upper limit and the lower limit of the power-supply voltage in the monitoring notification system 1 has been described. In an alternative embodiment, an upper limit and a lower limit of the power-supply voltage may be set in any other devices other the monitoring notification system 1.

REFERENCE SIGNS LIST

1 . . . Monitoring notification system (Electronic device)
2 . . . Testing device (Limit value setting apparatus)
52 . . . A/D converter
54 . . . Flash ROM (Memory)
56 . . . Microcomputer (Determination circuit)
62a . . . IG port (Port)
84 . . . High voltage (Predetermined voltage)
85 . . . Low voltage (Predetermined voltage)
541 . . . Upper limit (Limit value)
542 . . . Lower limit value (Limit value)

The invention claimed is:

1. A method of fabricating an electronic device, the electronic device including a port, an A/D converter, a memory, and a determination circuit, the determination circuit being configured to determine whether or not there is an abnormality by comparing an A/D converted value as a result of the A/D converter converting a voltage based on a power-supply voltage inputted to the port with a limit value stored in the memory, the method comprising steps of: during fabrication of the electronic device, a testing device inputting a predetermined voltage to the port of the electronic device to be fabricated; and
the electronic device recording the limit value in the memory, the recording step comprising:
the A/D converter of the electronic device converting a voltage based on the predetermined voltage inputted to the port;

the testing device receiving from the electronic device the A/D converted value as a result of the A/D converter converting the voltage based on the predetermined voltage;

the testing device in turn transmitting the A/D converted value received from the electronic device to the electronic device; and the electronic device recording the A/D converted value received from the testing device as the limit value in the memory.

2. The method of claim 1, wherein the determination circuit is configured to determine whether or not there is an abnormality based on whether or not the A/D converted value as a result of the A/D converter converting the voltage based on the power-supply voltage inputted to the port is out of a range between an upper limit and a lower limit stored in the memory, the inputting step comprises inputting a predetermined high voltage to the port of the electronic device to be fabricated and inputting a predetermined low voltage to the port of the electronic device to be fabricated, and the recording step comprises recording the A/D converted value as a result of the A/D converter converting a voltage based on the predetermined high voltage inputted to the port as the upper limit in the memory and recording the A/D converted value as a result of the A/D converter converting a voltage based on the predetermined low voltage inputted to the port as the lower limit in the memory.

3. A method of fabricating a plurality of electronic devices, each of the electronic devices including a port, an A/D converter, a memory, and a determination circuit, the determination circuit being configured to determine whether or not there is an abnormality by comparing an A/D converted value as a result of the A/D converter converting a voltage based on a power-supply voltage inputted to the port with a limit value stored in the memory, the method comprising steps of: during fabrication of each of the plurality of the electronic devices, a testing device inputting a predetermined voltage to the port of the electronic device to be fabricated, the predetermined voltage being common between the plurality of electronic devices to be fabricated; and the electronic device recording the limit value in the memory, the recording step comprising:

the A/D converter of the electronic device converting a voltage based on the predetermined voltage inputted to the port;

the testing device receiving from the electronic device the A/D converted value as a result of the A/D converter converting the voltage based on the predetermined voltage;

the testing device in turn transmitting the A/D converted value received from the electronic device to the electronic device; and the electronic device recording the A/D converted value received from the testing device as the limit value in the memory.

4. A method of setting a limit value of an electronic device, the electronic device including a port, an A/D converter, a memory, and a determination circuit, the determination circuit being configured to determine whether or not there is an abnormality by comparing an A/D converted value as a result of the A/D converter converting a voltage based on a power-supply voltage inputted to the port with a limit value stored in the memory, the method comprising steps of: during fabrication of the electronic device, a testing device inputting a predetermined voltage to the port of the electronic device to be fabricated; and the electronic device recording the limit value in the memory, the recording step comprising:

the A/D converter of the electronic device converting a voltage based on the predetermined voltage inputted to the port;

the testing device receiving from the electronic device the A/D converted value as a result of the A/D converter converting the voltage based on the predetermined voltage;

the testing device in turn transmitting the A/D converted value received from the electronic device to the electronic device; and the electronic device recording the A/D converted value received from the testing device as the limit value in the memory.

5. A limit value setting apparatus for applying a voltage to an electronic device, the electronic device including a port, an A/D converter, a memory, and a determination circuit, the determination circuit being configured to determine whether or not there is an abnormality by comparing an A/D converted value as a result of the A/D converter converting a voltage based on a power-supply voltage inputted to the port with a limit value stored in the memory, the apparatus comprising:

a digital interface configured to, during set up of the limit value of the electronic device, transmit a command to the electronic device;

an analog interface configured to, during set up of the limit value of the electronic device, apply a voltage to the port of the electronic device; and a control circuit configured to, during set up of the limit value of the electronic device, input a predetermined voltage to the port of the electronic device via the analog interface and transmit the command via the digital interface to receive from the electronic device an A/D converted value as a result of the A/D converter converting a voltage based on the predetermined voltage inputted to the port and transmit the A/D converted value received from the electronic device to the electronic device, thereby causing the electronic device to record the A/D converted value received from the apparatus as the limit value in the memory.

6. The apparatus of claim 5, wherein the determination circuit is configured to determine whether or not there is an abnormality based on whether or not the A/D converted value as a result of the A/D converter converting the voltage based on the power-supply voltage inputted to the port is out of a range between an upper limit and a lower limit stored in the memory, and the control circuit is configured to, during set up of the limit value of the electronic device, input a predetermined high voltage to the port of the electronic device via the analog interface and input a predetermined low voltage to the port of the electronic device via the analog interface, and transmit the command via the digital interface, thereby causing the electronic device to record an A/D converted value as a result of the A/D converter converting a voltage based on the predetermined high voltage inputted to the port as the upper limit in the memory and record an A/D converted value as a result of the A/D converter converting a voltage based on the predetermined low voltage inputted to the port as the lower limit in the memory.

7. A limit value setting apparatus for applying a voltage to a plurality of electronic devices, each of the electronic device including a port, an A/D converter, a memory, and a determination circuit, the determination circuit being configured to determine whether or not there is an abnormality by comparing an A/D converted value as a result of the A/D converter converting a voltage based on a power-supply voltage inputted to the port with a limit value stored in the memory, the apparatus comprising:
- a digital interface configured to, during set up of the limit value of each of the plurality of the electronic devices, transmit a command to the electronic device;
- an analog interface configured to, during set up of the limit value of each of the plurality of the electronic devices, apply a voltage to the port of the electronic device, the voltage being common between the plurality of electronic devices; and
- a control circuit configured to, during set up of the limit value of each of the plurality of the electronic devices, input a predetermined voltage to the port of the electronic device via the analog interface and transmit the command via the digital interface to receive from the electronic device an A/D converted value as a result of the A/D converter converting a voltage based on the predetermined voltage inputted to the port and transmit the A/D converted value received from the electronic device to the electronic device, thereby causing the electronic device to record the A/D converted value received from the apparatus as the limit value in the memory.

* * * * *